United States Patent [19]

Anhalt et al.

[11] 3,900,239

[45] Aug. 19, 1975

[54] ELECTRICAL SOCKET ADAPTOR

[75] Inventors: John William Anhalt; David Samuel Goodman, both of Orange, Calif.

[73] Assignee: International Telephone and Telegraph Corporation, New York, N.Y.

[22] Filed: Sept. 4, 1973

[21] Appl. No.: 394,355

[52] U.S. Cl. .......................... 339/17 CF; 317/101 CP

[51] Int. Cl. .......................... H05k 1/07

[58] Field of Search .......... 339/17, 75, 66, 65, 192, 339/174, 94; 317/101 CP

[56] References Cited

UNITED STATES PATENTS

| | | | |
|---|---|---|---|
| 3,184,536 | 5/1965 | Vincent | 339/17 C |
| 3,263,200 | 7/1966 | Kocmich | 339/17 C |
| 3,380,016 | 4/1968 | Samson et al. | 339/17 CF |
| 3,673,543 | 6/1972 | Garner | 339/61 M |
| 3,685,002 | 8/1972 | Kennedy | 339/17 CF |
| 3,772,632 | 11/1973 | Rattcliff et al. | 339/17 CF |

FOREIGN PATENTS OR APPLICATIONS

| | | | |
|---|---|---|---|
| 1,918,474 | 10/1970 | Germany | 339/17 CF |

*Primary Examiner*—Roy D. Frazier
*Assistant Examiner*—Terrell P. Lewis
*Attorney, Agent, or Firm*—Thomas L. Peterson

[57] ABSTRACT

An electrical socket adaptor for interconnecting a dual in-line plug with a printed circuit board having plated-through holes therein. The adaptor comprises a body of resilient material having apertures formed therein which receive the leads of the dual in-line plug. Integral hubs are formed on the body below the apertures. These hubs have an interference fit with the plated-through holes in the printed circuit board for releasably retaining the adaptor on the board. The hubs also bias the leads of the dual in-line plug against the walls of the plated-through holes.

4 Claims, 5 Drawing Figures

PATENTED AUG 1 9 1975

3,900,239

ELECTRICAL SOCKET ADAPTOR

BACKGROUND OF THE INVENTION

This invention relates generally to an electrical socket adaptor and, more particularly, to such an adaptor for interconnecting an electrical circuit element having a plurality of electrical leads thereon with a mounting member having plated-through holes therein.

The present invention will be described specifically with respect to a socket adaptor for interconnecting an electrical circuit element, referred to in the art as a dual in-line plug, to a mounting member such as a printed circuit board. However, it will be appreciated that the connector assembly of the invention could be used for interconnecting other types of circuit elements to mounting members.

The socket adaptor of the type of which this invention relates is often referred to as a dual in-line package socket. There are a wide variety of such sockets known in the art. One general type of socket comprises a connector having individual contacts therein for each lead of the dual in-line plug. Other dual in-line package sockets are in the form of insulative adaptors which serve to directly interconnect the leads of the dual in-line plugs with conductive areas on printed circuit boards. Adaptors of this general type are disclosed, for example, in the following U.S. Pat. Nos. 3,366,914; 3,380,016; and 3,605,062. Another form of adaptor is disclosed in copending application of John E. Barr, entitled ELECTRICAL SOCKET ADAPTOR MEMBER, Ser. No. 263,296, filed June 19, 1972, and assigned to the assignee of the present invention. While the foregoing prior art dual in-line package sockets are generally satisfactory, they have one or more disadvantages. Some of the sockets require a multiplicity of components which raises the cost of the finished product. Also, the finished product is frequently large, that is, requires more volume than is absolutely necessary. These two latter mentioned considerations are of major importance for components used in high density, high production volume electronic units. In addition, some of the sockets require that the contacts therein be soldered into the printed circuit board. This is disadvantageous in that solder often remains on the wire wrapped post of the contacts and individual soldering of contacts into the printed circuit board is relatively expensive. Also, the solder must be removed from the contacts in order to replace them. In addition, special fastening means is usually required to hold the socket on the board. Further, most of the prior art sockets are not suitable for interconnecting the leads of electrical circuit elements to printed circuit boards having plated-through holes therein. The socket adaptor disclosed in the aforementioned Barr application is suitable for this purpose, but utilizes conductive spring members imbedded in the insulation body of the adaptor to interconnect the circuit element leads to the plated-through holes in the printed circuit board. These spring members obviously add to manufacturing costs.

The purpose of the present invention is to overcome the attendant disadvantages of the prior art dual in-line package sockets by providing a structure which is extremely simple in construction, thereby minimizing production costs, by eliminating components and permitting the use of high production techniques with a minimum of assembly required. More particularly, by the present invention, the cost and inconvenience of utilizing soldering techniques to fix socket contacts in printed circuit boards is eliminated. In addition, the socket adaptor is formed of a one piece unitary insulative body and, thus, does not require individual spring members as in the socket adaptor disclosed in the aforementioned Barr application.

SUMMARY OF THE INVENTION

The principal object of the present invention is to provide a simple and inexpensive electrical socket adaptor.

According to the principal aspect of the present invention, there is provided an electrical socket adaptor for interconnecting the electrical leads of an electrical circuit element, such as a dual in-line plug, with a mounting member having plated-through holes therein. The adaptor comprises a body of resilient insulative material having a plurality of apertures therein for receiving the leads of the electrical circuit element. A plurality of integral resilient hubs are formed on the body which extend downwardly from the lower surface for resilient mounting in the plated-through holes in the mounting member. A hub is provided adjacent to each of the apertures which receive the leads from the electrical circuit element. The apertures open at the lower surface of the body to one side of the hubs so that when the electrical circuit element is mounted on top of the adaptor with the leads extending through the apertures, the leads will lie along one side of the hubs. As a consequence, the resilient hubs will bias the leads into firm contact with the walls of the plated-through holes, thus providing good electrical contact between the leads and the plated-through holes. Thus, electrical connection is provided between these parts without the requirement of separate electrical contacts. As a consequence, by the present invention there is provided an electrical socket adaptor which may be formed of a unitary body, thereby minimizing manufacturing costs and eliminating assembly operations. The hubs on the body serve the dual purpose of releasably securing the socket adaptor, and thus the electrical circuit element, to the printed circuit board and provide the resilient force for pressing the leads of the circuit element into good electrical contact with the plated-through holes. Thus, soldering and special fastening devices are eliminated.

DESCRIPTION OF THE PREFERRED EMBODIMENT

Figure 1:
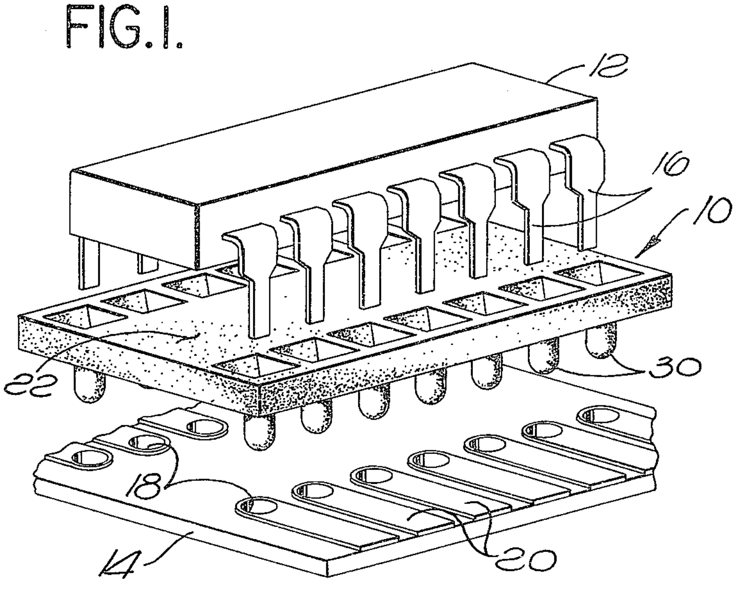
FIG. 1 is a perspective view illustrating an electrical circuit element positioned to be mounted in an electrical socket adaptor constructed in accordance with the present invention, such adaptor being positioned over a printed circuit board.
Figure 2:
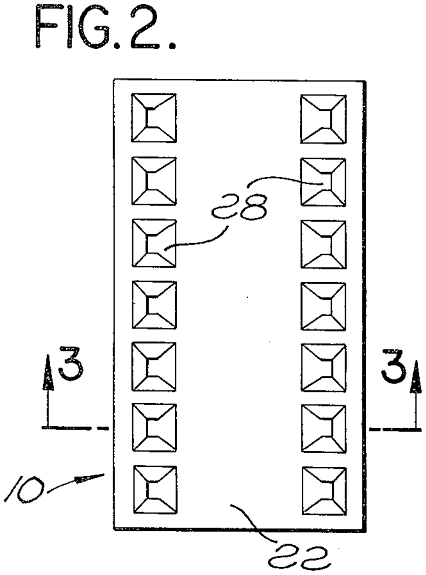
FIG. 2 is a top plan view of the socket adaptor shown in FIG. 1.

Referring now to FIG. 1 in detail, there is shown the electrical socket adaptor of the present invention, generally designated 10, which may be used to interconnect an electrical circuit member 12 to a mounting member 14. The electrical circuit element 12, which may be a dual in-line plug, has a plurality of electrical leads 16 which extend laterally outwardly from the opposite sides of the element and downwardly below the lower surface thereof. The element may be an integrated circuit or other electrical circuit component.

The mounting member 14 is a printed circuit board which may be either double-sided or multi-layered in construction. The board is formed with two rows of holes 18 therein which are plated-through with a conductive metal coating as well known in the art. Conductive layers or traces 20 are shown on the top and bottom surfaces of the board 14 extending outwardly from each of the plated-through holes 18. The socket adaptor 10 comprises a one piece unitary molded body 22 formed of a suitable resilient insulative material. Any elastomer may be utilized such as rubber or thermoplastic. The body includes an upper surface 24 and a lower surface 26. Two rows of apertures 28 are formed in the body 22. The apertures are arranged in a pattern corresponding to the arrangement of the downwardly extending portions of the electrical leads 16 on the element 12.

Integral hubs 30 are formed on the body 22 and extend downwardly from the lower surface 26 thereof. The hubs are arranged in a pattern corresponding to that of the plated-through holes 18 in the printed circuit board. Each hub is positioned below a respective aperture 28. The hubs, being integral parts of the resilient body 22, are likewise resilient and are dimensioned to have an interference fit with the plated-through holes 18 in the printed circuit board. Thus, the hubs 30 serve to releasably retain the adaptor 10 on the printed circuit board.

Each aperture 28 is formed by inclined side walls 32 and 34 which face each other and extend in the same direction as each row of hubs 30. The side walls converge downwardly toward the lower surface 26 of the body 22. The planes of the side walls intersect below such lower surface so that the aperture 28 opens at the lower surface of the body.

Figures 3, 4:
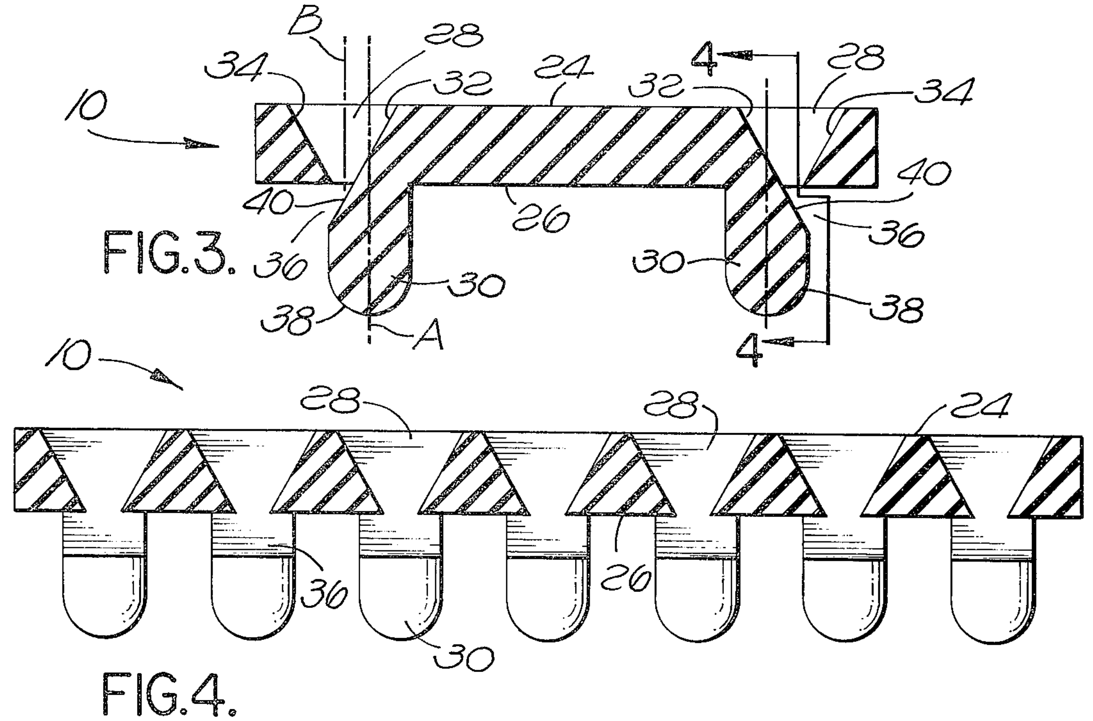
FIG. 3 is a transverse vertical sectional view taken along line 3—3 of FIG. 2.
FIG. 4 is a longitudinal vertical sectional view taken along line 4—4 of FIG. 3.

The vertical center line A of each row of hubs 30 is offset inwardly from the center axis B of the corresponding row of apertures 28. Also, a notch 36 is formed in the outside surface 38 of each hub 30 immediately adjacent the lower surface 26 of the body 22. The notch 36 provides an upwardly facing slanted surface 40 which forms a continuation of the inclined side wall 32 of the aperture. Thus, as best seen in FIG. 3, each aperture 28 opens through the lower surface 26 of the body 22 adjacent to the outside surface 38 of its respective hub 30. As a consequence, a portion of each hub 30 extends below the bottom of each aperture 28.

Figure 5:
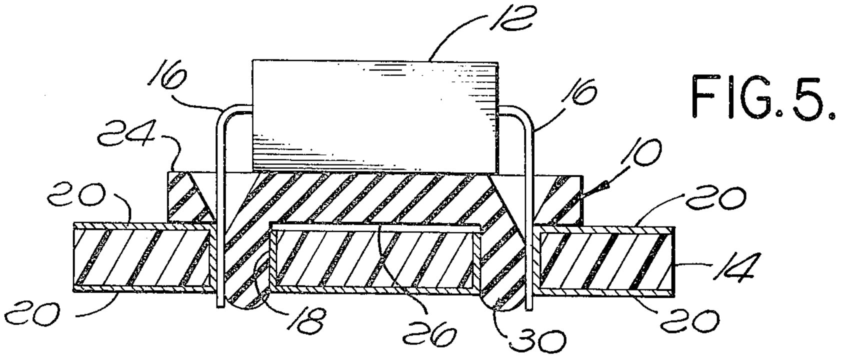
FIG. 5 is a transverse, partial vertical sectional view showing the socket adaptor interconnecting the electrical circuit element with the printed circuit board.

To interconnect the electrical circuit element 12 to the printed circuit board 14, the socket adaptor 10 is first mounted on the board by press-fitting the hubs 30 into the plated-through holes 18. As stated previously, the hubs have an interference fit with the holes 18 and, thus, will retain the socket adaptor on the board. Thereafter, the electrical circuit element is mounted on the socket adaptor with the leads 16 aligned with the apertures 28. When the element 12 is pressed downwardly, the leads will engage the upwardly facing slanted surfaces 40 on the hubs 30 tending to compress or squeeze the hubs laterally. When the circuit element 12 is fully mounted on the socket adaptor 10, as seen in FIG. 5, the leads 16 will deform the hubs 30 and will become tightly interposed between the hubs and the walls of the plated-through holes 18. The leads, thus, laterally compress or squeeze the hubs 30 so that, by the inherent resiliency of the hubs, the hubs will exert a biasing force upon the leads to hold them firmly into electrical contact with the walls of the plated-through holes 18.

From the foregoing, it is seen that by the present invention a simple and inexpensive socket adaptor is provided which may be secured to a printed circuit board by simply press-fitting hubs into plated-through holes formed in the board. The hubs also serve the function of exerting a biasing force on the electrical circuit element leads 16 to hold them in firm electrical engagement with the walls of the plated-through holes. Thus, the cost and inconvenience of utilizing soldering techniques is eliminated. In addition, no separate fastening elements are required to secure the adaptor upon the printed circuit board. The adaptor also has a low profile and has a width only slightly greater than that of the electrical circuit elements 12, thus, lending to high density packaging. The adaptor also permits the rapid insertion and extraction of electrical circuit elements in the same manner as do standard contact-type integrated circuit rockets. Further, when soldering discrete elements to a printed circuit board with the adaptor of the present invention inserted in plated-through holes therein, flowing solder will not affect rash holes since they are filled by the hubs 30. Other advantages of the invention will be apparent to those skilled in the art.

What is claimed is:

1. An electrical socket adaptor for interconnecting an electrical circuit element having electrical leads extending therefrom with a mounting member having plated-through holes therein, comprising:

a body of resilient insulative material having an upper surface and a lower surface;

a plurality of apertures in said body opening at said upper surface thereof and arranged in a pattern corresponding to the arrangement of said electrical circuit element leads;

a plurality of integral resilient hubs on said body extending downwardly from said lower surface thereof, each said hub being positioned in juxtaposition to a respective one of said apertures and being adapted to be resiliently mounted in one of said plated-through holes; and said apertures opening at the lower surface of said body adjacent to one side of their respective hubs, each said hub having a portion positioned below and spaced from the bottom of its respective aperture whereby, when said socket adaptor interconnects said electrical circuit element and said mounting member, the electrical circuit element leads extending downwardly through said apertures will be biased against the walls of said plated-through holes by said resilient hubs, each said aperture including a pair of inclined side walls converging downwardly toward said lower surface of said body, said planes of said side walls intersecting below said lower surface.

2. A socket adaptor as set forth in claim 1 wherein a notch is formed in the upper portion of each hub adjacent to said lower surface defining an upwardly facing slanted surface forming a continuation of one of said inclined walls and spaced from the other inclined wall providing the opening for said aperture at said lower surface.

3. An electrical connector assembly for receiving an electrical circuit element having electrical leads extending therefrom, comprising:

a mounting member having plated-through holes therein corresponding in number and arrangement to that of said electrical circuit element leads;

a body of resilient insulative material having an upper surface and a lower surface;

a plurality of apertures in said body opening at said upper surface thereof and arranged in a pattern corresponding to the arrangement of said leads;

a plurality of integral resilient hubs on said body extending downwardly from said lower surface thereof into said holes, each said hub being positioned in juxtaposition to a respective one of said apertures; and said apertures opening at the lower surface of said body adjacent to one side of their respective hubs, each said hub having a portion positioned below and spaced from the bottom of its respective aperture, each said hub portion having formed thereon, immediately below the bottom of said aperture, an upwardly facing inclined surface whereby said leads extending downwardly through said apertures will be biased against the walls of said holes by said resilient hubs.

4. An electrical socket adaptor for interconnecting an electrical circuit element having electrical leads extending therefrom with a mounting member having plated-through holes therein, comprising:

a body of resilient insulative material having an upper surface and a lower surface;

a plurality of apertures in said body opening at said upper surface thereof and arranged in a pattern corresponding to the arrangement of said electrical circuit element leads;

a plurality of integral resilient hubs on said body extending downwardly from said lower surface thereof, each said hub being positioned in juxtaposition to a respective one of said apertures and being adapted to be resiliently mounted in one of said plated-through holes;

said apertures opening at the lower surface of said body adjacent to one side of their respective hubs, each hub having a portion positioned below and spaced from the bottom of its respective aperture, said portions having formed thereon, immediately below the bottom of said aperture, an upwardly facing inclined surface whereby, when said socket adaptor interconnects said electrical circuit element and said mounting member, the electrical circuit element leads extending downwardly through said apertures will be biased against the walls of said plated through holes by said resilient hubs.

* * * * *